US008451027B2

(12) United States Patent  (10) Patent No.: US 8,451,027 B2
Jiang  (45) Date of Patent: May 28, 2013

(54) PSEUDO FULL-RATE SENSE AMPLIFIER FLIP-FLOP FOR HIGH-SPEED RECEIVER FRONT-END

(75) Inventor: Kunlun Kenny Jiang, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 13/083,641

(22) Filed: Apr. 11, 2011

(65) Prior Publication Data

US 2012/0256672 A1   Oct. 11, 2012

(51) Int. Cl.
    *G01R 19/00*   (2006.01)
(52) U.S. Cl.
    USPC .......................................................... 327/55
(58) Field of Classification Search
    None
    See application file for complete search history.

(56) References Cited

U.S. PATENT DOCUMENTS

| 6,597,626 B2* | 7/2003 | Hirabayashi | 365/233.1 |
| 7,782,243 B1* | 8/2010 | Lu | 341/172 |
| 8,115,529 B2* | 2/2012 | Shibata | 327/198 |
| 2003/0137324 A1* | 7/2003 | Park et al. | 327/55 |

OTHER PUBLICATIONS

Nikolic, Borivoje et al., "Sense Amplifier-Based Flip-Flop," 1999 IEEE International Solid-State Circuits Conference, Session 16, Paper TP 16.5, 1999, pp. 282-283, 468.

* cited by examiner

*Primary Examiner* — Lincoln Donovan
*Assistant Examiner* — Sibin Chen
(74) *Attorney, Agent, or Firm* — Abel Law Group, LLP

(57) ABSTRACT

An apparatus includes a first sensing circuit operative to drive a node with a first sample of an input signal during a first phase of a clock signal. The apparatus includes a second sensing circuit operative to drive the node with a second sample of the input signal during a second phase of the clock signal. An output signal on the node includes the first and second samples and has a bit rate that is N times the rate of the clock signal. N is an integer greater than one. In at least one embodiment of the apparatus, during the second phase of the clock signal, the first sensing circuit provides a high impedance to the node, and during the first phase of the clock signal, the second sensing circuit provides a high impedance to the node.

20 Claims, 6 Drawing Sheets

PSEUDO FULL-RATE SENSE AMPLIFIER FLIP-FLOP FOR HIGH-SPEED RECEIVER FRONT-END

BACKGROUND

1. Field of the Invention

The invention is related to integrated circuits and more particularly to sampling circuits of integrated circuits.

2. Description of the Related Art

A typical receiver front-end circuit uses one or more state elements (e.g., flip-flops) to sample input signals. State elements with short setup and hold times used in high-speed, low-power receiver front-ends include sense amplifier-based flip-flops. However, as clock speeds and/or loading of the receiver circuits increase, limits on the performance of those state elements (e.g., effects of limits on device performance, uncorrected clock duty cycle distortion, and variation of input common-mode voltage levels) affect the amplitude (e.g., voltage swing and signal-to-noise ratio) and timing (e.g., jitter and delay) of the sampled signal.

SUMMARY OF EMBODIMENTS OF THE INVENTION

In at least one embodiment of the invention, an apparatus includes a first sensing circuit operative to drive a node with a first sample of an input signal during a first phase of a clock signal. The apparatus includes a second sensing circuit operative to drive the node with a second sample of the input signal during a second phase of the clock signal. An output signal on the node includes the first and second samples and has a bit rate that is N times the rate of the clock signal. N is an integer greater than one. In at least one embodiment of the apparatus, during the second phase of the clock signal, the first sensing circuit provides a high impedance to the node, and during the first phase of the clock signal, the second sensing circuit provides a high impedance to the node.

In at least one embodiment of the invention, a method includes, during a first phase of a clock signal, driving an output node with a first sample of a signal by a first sensing circuit and providing a high impedance to the output node by a second sensing circuit. The method includes, during a second phase of the clock signal, providing a high impedance to the output node by the first sensing circuit and driving the output node with a second sample of the signal. The signal is sampled at a rate that is N times the rate of the clock signal. N is an integer greater than one. In at least one embodiment of the method, the first phase of the clock signal corresponds to a first unit interval of a full-rate clock signal and the second phase of the clock signal corresponds to a second unit interval of the full-rate clock signal.

In at least one embodiment of the invention, an apparatus includes a means for driving a first sample of a signal on an output node during a first phase of a clock signal and providing a high impedance to the output node during a second phase of the clock signal. The apparatus includes a means for providing a high impedance to the output node during a second phase of the clock signal and driving a second sample of the signal on the output node during a first phase of the clock signal. The signal is sampled at a rate that is N times the rate of the clock signal. N is an integer greater than one.

In at least one embodiment of the invention, a tangible computer-readable medium encodes a representation of an integrated circuit that includes a first sensing circuit operative to drive on a node during a first phase of a clock signal a first sample of a signal. The first sensing circuit is inoperative during a second phase of the clock signal. The integrated circuit includes a second sensing circuit operative to drive on the node during the second phase of the clock signal a second sample of the signal. The second sensing circuit is inoperative during the first phase of the clock signal. A sampled signal on the node includes the first and second samples and has a bit rate that is N times the rate of the clock signal. N is an integer greater than one. In at least one embodiment of the tangible computer-readable medium, the first sensing circuit includes a first pair of cross-coupled devices and the second sensing circuit comprises a second pair of cross-coupled devices.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
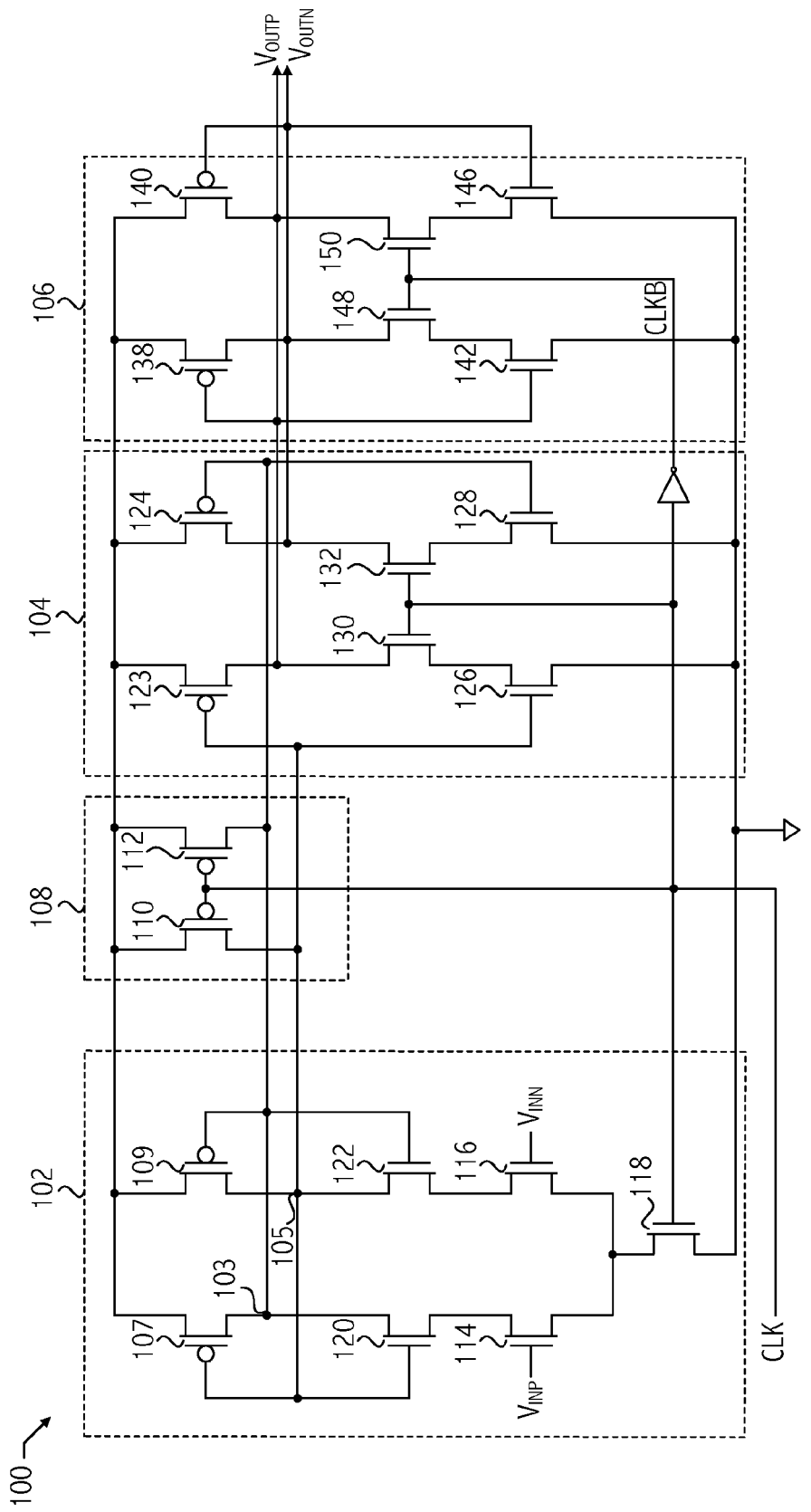
FIG. 1 illustrates a circuit diagram of an exemplary full-rate sense amplifier flip-flop.
Figure 2:
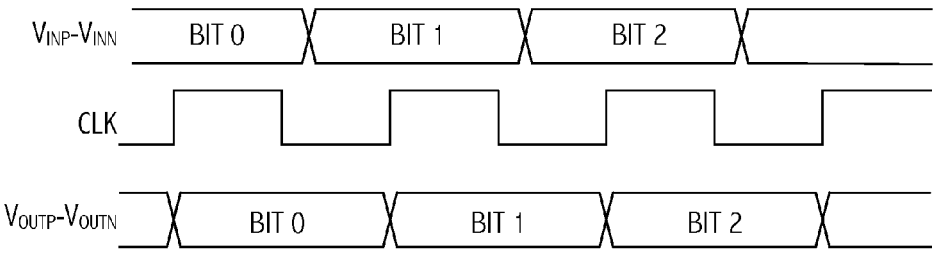
FIG. 2 illustrates waveforms consistent with the exemplary full-rate sense amplifier flip-flop of FIG. 1.

In an exemplary integrated circuit application, e.g., a receiver front-end circuit, a sense amplifier flip-flop samples received analog signals and provides a full swing CMOS output signal based on the analog input signal. Referring to FIGS. 1 and 2, a typical sense amplifier flip-flop (e.g., flip-flop 100) receives an analog signal input on a differential input node (e.g., $V_{INN}$ and $V_{INP}$) and provides a full-swing CMOS output signal (e.g., a signal on output node $V_{OUTN}$ and $V_{OUTP}$). Flip-flop 100 includes a first stage (e.g., circuit 102), a second stage (e.g., circuit 104 and circuit 106), and a pre-charging stage (e.g., circuit 108). In operation, when the clock signal is low (i.e., CLK='0'), devices in precharging circuit 108 are enabled and precharge nodes 103 and 105 to a predetermined voltage level (e.g., approximately a power supply voltage, which in at least one embodiment is approximately $V_{DD}$). Circuit 102 includes cross-coupled devices 107 and 109 coupled to nodes 103 and 105, which are reset when the clock signal is low. During this low phase of the clock signal, the input differential pair of devices (e.g., differential pair of devices 114 and 116) is disabled. In addition, input devices of circuit 104 (e.g., devices 126 and 128) of the output stage are also disabled.

When the clock signal is rising from low (i.e., CLK='0') to high (i.e., CLK='1'), devices in precharging circuit 108 are disabled and device 118 is enabled, thereby enabling the input differential pair of devices 114 and 116 to generate a differential signal on the output node $V_{OUTN}$ and $V_{OUTP}$ based on the differential input signal on $V_{INP}$ and $V_{INN}$ causing one of devices 120 and 122 to turn on and discharge one of nodes 103 and 105 in response to the differential input signal. Cross-coupled devices 107 and 109 detect any voltage difference in the input signal and amplify that difference on nodes 103 and 105 to cause one of nodes 103 and 105 to maintain a voltage of approximately $V_{DD}$ and the other of nodes 103 and 105 to be discharged to approximately $V_{SS}$. The high clock signal enables devices 130 and 132. The differential voltage on nodes 103 and 105 enables a branch of circuit 104, e.g., enables one of devices 123 and 124 and enables one of devices 126 and 128. That is, either devices 124 and 126 are enabled, thereby discharging node $V_{OUTN}$ and charging node $V_{OUTP}$, or devices 123 and 128 are enabled, thereby charging node $V_{OUTN}$ and discharging node $V_{OUTP}$ to generate a differential voltage on $V_{OUTN}$ and $V_{OUTP}$. Meanwhile, devices 148 and 150 are disabled, preventing either of devices 142 and 146 from discharging nodes $V_{OUTN}$ and $V_{OUTP}$ during the high phase of the clock. One of devices 138 and 140 is enabled according to the differential voltage on $V_{OUTN}$ and $V_{OUTP}$ to charge one of $V_{OUTN}$ and $V_{OUTP}$ consistent with the enabled one of devices 123 and 124. Accordingly, during the high phase of the clock signal, a differential voltage develops on $V_{OUTN}$ and $V_{OUTP}$ in response to the differential voltage on nodes 103 and 105.

During the low phase of the clock signal, devices 130 and 132 are disabled, preventing devices 126 and 128 from discharging $V_{OUTN}$ and $V_{OUTP}$. Devices 148 and 150 are enabled. In addition, one of devices 142 and 146 and one of devices 138 and 140 are enabled, which maintain the differential voltage on $V_{OUTN}$ and $V_{OUTP}$. As the frequency of the clock signal increases, the quality of the signal on $V_{OUTN}$ and $V_{OUTP}$ of flip-flop 100 decreases, (i.e., the amplitude (e.g., voltage swing and signal-to-noise ratio) and timing (e.g., jitter and delay) of the sampled signal deteriorate), for example, as a result of the time required to precharge and discharge nodes 103 and 105.

Figure 4:
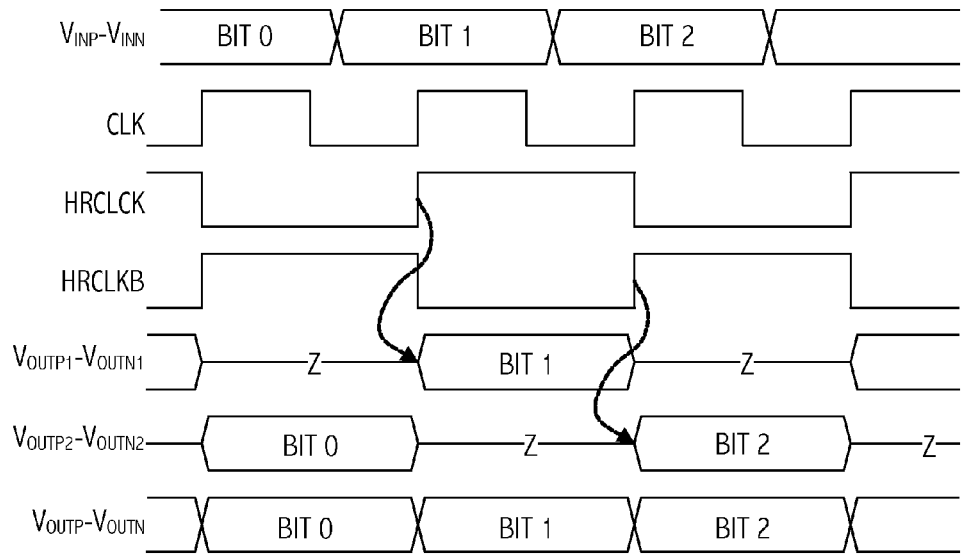
FIG. 4 illustrates waveforms consistent with the exemplary pseudo full-rate sense amplifier flip-flop of FIG. 3, consistent with at least one embodiment of the invention.
Figure 3A:
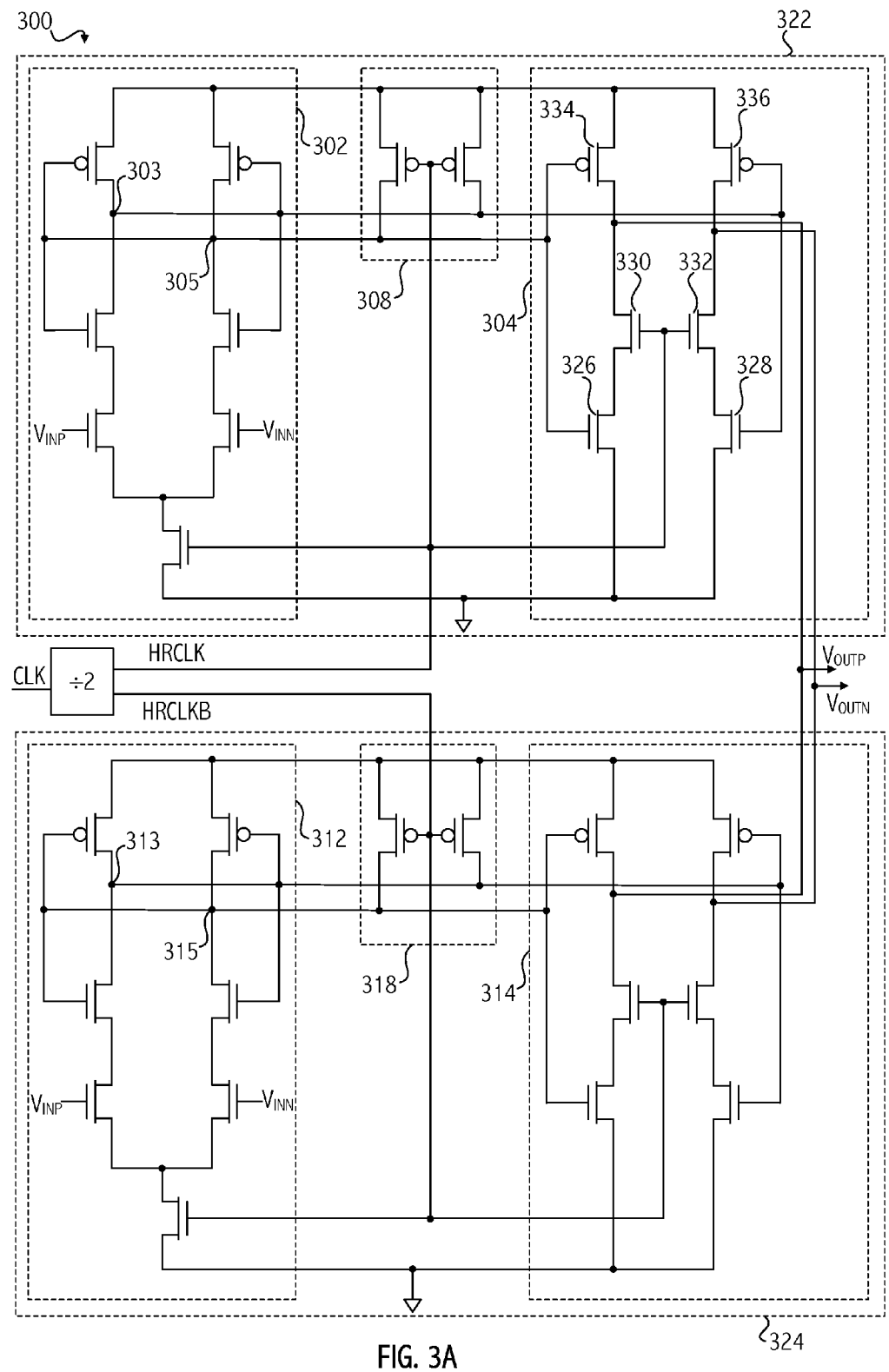
FIGS. 3A and 3B illustrate circuit diagrams of exemplary pseudo full-rate sense amplifier flip-flops consistent with various embodiments of the invention.

A multiplexed, full-rate sense amplifier technique for sampling a differential input signal having a high data rate includes sampling the input signal at half of the data rate using two full sense amplifier flip-flops to generate two half-rate signals and multiplexing the two half-rate data signals to generate a full-rate data signal. That technique increases the hardware as compared to flip-flop 100 and increases the latency of the signal, which may not be acceptable in some applications. Referring to FIGS. 3A and 4, a technique for sampling input signals that uses less hardware and has a reduced latency as compared to the multiplexed, full-rate sense amplifier technique includes a pseudo full-rate sense amplifier flip-flop (e.g., pseudo full-rate sense amplifier flip-flop 200) that samples an input signal (e.g., an input signal on differential input node $V_{INP}$ and $V_{INN}$) at half of the data rate to generate two half-rate signals. The pseudo full-rate sense amplifier flip-flop uses two modified sense amplifier circuits (e.g., modified sense amplifier 322 and modified sense amplifier 324) operating on opposite clock edges of a half-rate clock signal to generate a full-rate data signal on $V_{OUTN}$ and $V_{OUTP}$.

In at least one embodiment of pseudo full-rate sense amplifier flip-flop 300, HRCLK and HRCLKB are complementary, half-rate clock signals. Modified sense amplifier circuit 322 precharges nodes 303 and 305 during the low phase of HRCLK and evaluates the input on $V_{INN}$ and $V_{INP}$ during the rising edge of HRCLK. Modified sense amplifier circuit 324 precharges nodes 313 and 315 during the low phase of HRCLKB and evaluates the input on $V_{INN}$ and $V_{INP}$ during the rising edge of HRCLKB. During a low phase of HRCLK, precharging circuit 308 precharges nodes 303 and 305 of modified sense amplifier 322 to approximately $V_{DD}$ and circuit 304 is disabled, providing a high-impedance on the output node. In at least one embodiment of circuit 200, a complementary design is used and during the low phase of HRCLK, precharging circuit 308 precharges nodes 303 and 305 of modified sense amplifier 322 to approximately $V_{DD}$ and circuit 304 is disabled. Modified sense amplifier circuit 322 provides a high-impedance to the output node. Although the actual sampling clocks HRCLK and HRCLKB have half the frequency with respect to the data rate of the input signal, each of the sampled data signal outputs of modified sense amplifier 322 and modified sense amplifier 324 are valid for only half of the unit intervals of the full-rate clock signal, i.e., alternating unit intervals. The outputs of modified sense amplifier 322 and modified sense amplifier 324, which provide valid data on opposite clock edges, are combined by the output node $V_{OUTN}$ and $V_{OUTP}$ to generate a full-rate sampled version of the input signal. In at least one embodiment of pseudo full-rate sense amplifier flip-flop 300, only one of circuits 304 and 314 provides a valid voltage level on differential output node $V_{OUTP}$ and $V_{OUTN}$.

Figure 3B:
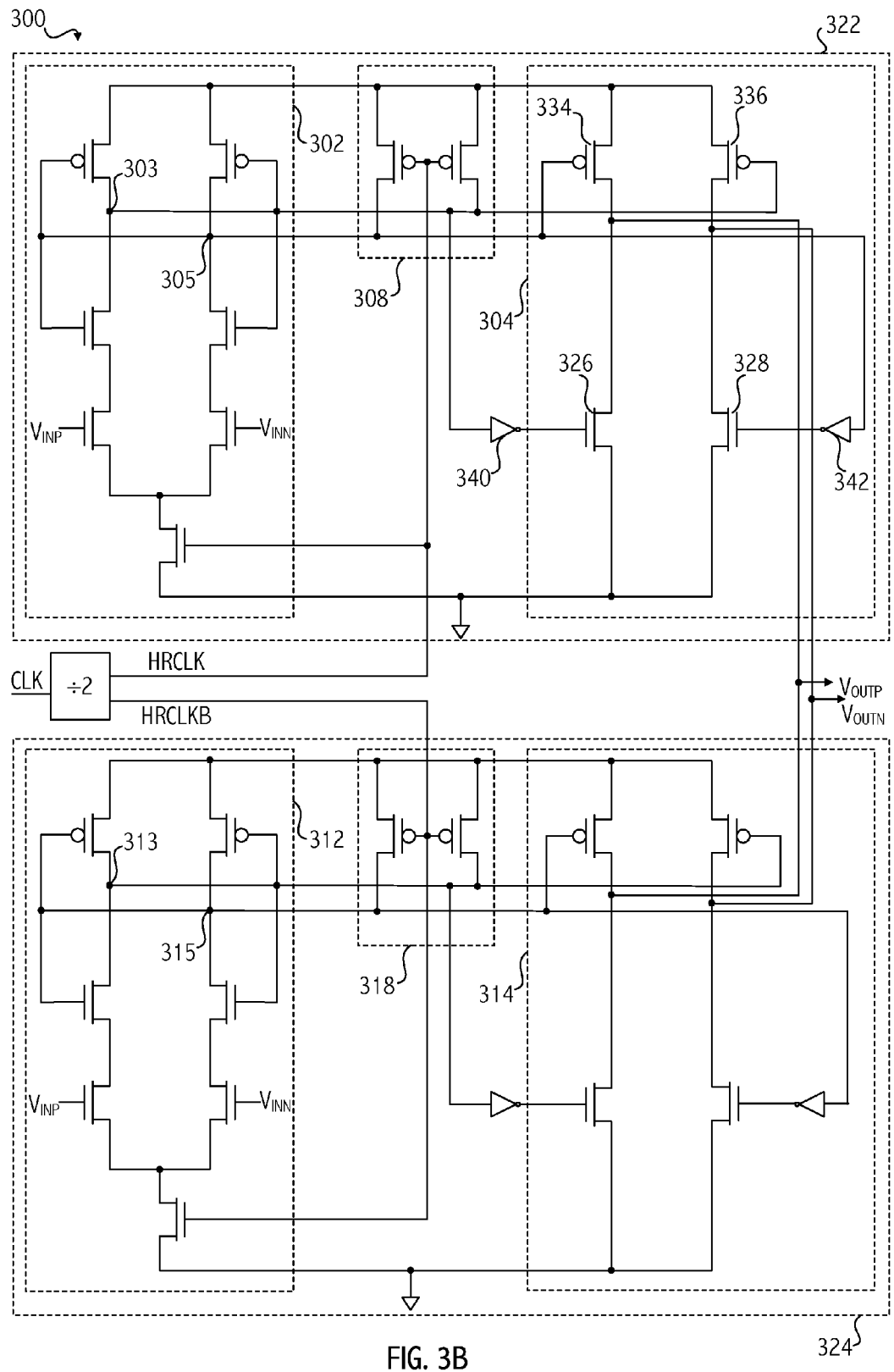

Referring to FIG. 3B, in at least one embodiment of pseudo full-rate sense amplifier flip-flop 300, devices 330 and 332 of modified sense amplifier 322 are not included. Rather, device 326 is directly connected to $V_{OUTP}$ and device 328 is directly connected to $V_{OUTN}$. Node 305 is connected to inverter 340 and the inverter output is connected to the gate terminal of device 328. Node 303 is connected to inverter 342 and the inverter output is connected to gate terminal of device 326. Modified sense amplifier 324 is modified similar to modified sense amplifier 322.

Figure 5:
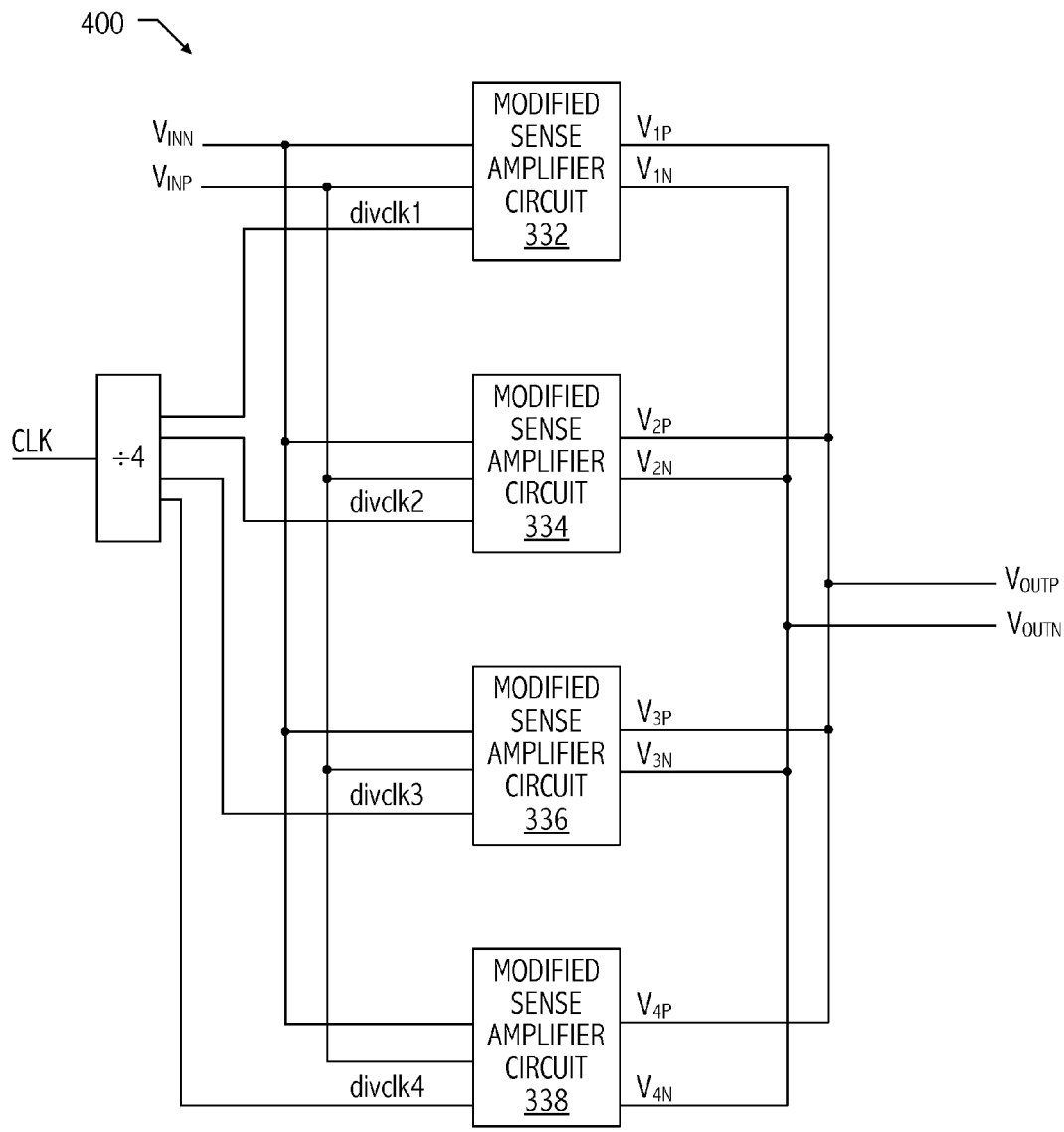
FIG. 5 illustrates a circuit diagram of an exemplary pseudo full-rate sense amplifier flip-flop consistent with at least one embodiment of the invention.
Figure 6:
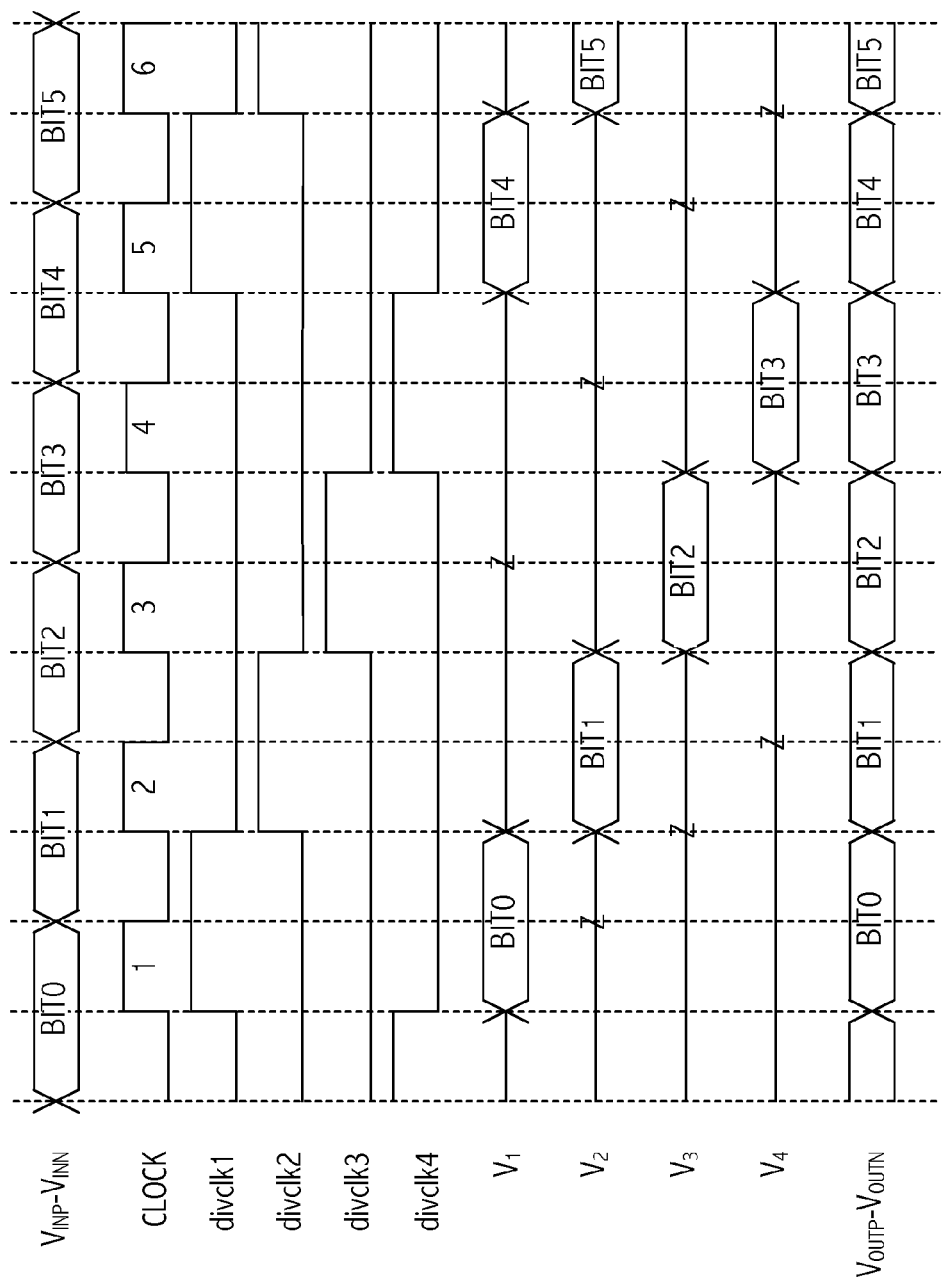
FIG. 6 illustrates waveforms consistent with the exemplary pseudo full-rate sense amplifier flip-flop of FIG. 5, consistent with at least one embodiment of the invention.

The techniques described above are not limited to using only two modified sense amplifiers and a half rate clock, but may be extended to other numbers of modified sense amplifiers and a clock signal having a frequency that is a fraction of the full-rate clock signal frequency. Referring to FIGS. 5 and 6, in at least one embodiment, a pseudo full-rate sense amplifier flip-flop (e.g., pseudo full-rate sense amplifier flip-flop 400) includes N (i.e., an integer number greater than one, e.g., four) modified sense amplifier circuits (e.g., modified sense amplifier circuits 332, 334, 336, and 338) controlled by N non-overlapping clock signals (e.g., $divclk_1$, $divclk_2$, $divclk_3$, and $divclk_4$). In at least one embodiment of circuit 400, at any particular time, only one of the four phases of the frequency-divided version of a local clock signal is active while the others remain inactive. Accordingly, $divclk_1$, $divclk_2$, $divclk_3$, and $divclk_4$ trigger corresponding modified sense amplifier circuits at different times so that they sample the data signal at different unit intervals of the full-rate clock signal and are inoperative during other phases of the full-rate clock signal. In at least one embodiment, clock generator circuit 402 generates $divclk_1$, $divclk_2$, $divclk_3$, and $divclk_4$ using any suitable technique (e.g., delay elements, logic devices, or clock gating circuits). The outputs of modified sense amplifier circuits 332, 334, 336, and 338 are combined at the output node (e.g., differential output node $V_{OUTP}$ and $V_{OUTN}$) to generate a full-rate sampled version of the input signal.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable media having encodings thereon (e.g., HDL, Verilog, GDSII data) of such circuits, systems, and methods, all as described herein, and as defined in the appended claims. In addition, the computer readable media may store instructions as well as data that can be used to implement the invention. The instructions/data may be related to hardware, software, firmware or combinations thereof The description of the invention set forth herein is illustrative, and is not intended to limit the scope of the invention as set forth in the following claims. For example, while the invention has been described in an embodiment in which a particular modified sense amplifier circuit is used, one of skill in the art will appreciate that the teachings herein can be utilized with other sense amplifier circuit configurations that provide valid sampled data in a first phase of a control clock signal and have a high impedance output during the second phase of the control clock signal. Variations and modifications of the embodiments disclosed herein, may be made based on the description set forth herein, without departing from the scope and spirit of the invention as set forth in the following claims.

What is claimed is:

1. An apparatus comprising:
   a first sensing circuit operative to drive a node with a first sample of an input signal during a first phase of a clock signal, the first sensing circuit comprising:
      a first sampling stage operative to receive the input signal on a differential input node and operative to sense a first difference between voltages on individual nodes of the differential input node during the first phase of the clock signal; and
      a first output stage operative to drive the first difference onto the node during the first phase of the clock signal, the first output stage being inoperative during a second phase of the clock signal; and
   a second sensing circuit operative to drive the node with a second sample of the input signal during the second phase of the clock signal,
   wherein an output signal on the node includes the first and second samples and has a bit rate that is N times the rate of the clock signal, N being an integer greater than one.

2. The apparatus, as recited in claim wherein during the second phase of the clock signal, the first sensing circuit is operative to provide a high impedance to the node, and during the first phase of the clock signal, the second sensing circuit is operative to provide a high impedance to the node.

3. The apparatus, as recited in claim 1, wherein the first phase of the clock signal corresponds to a first unit interval of a full-rate clock signal and the second phase of the clock signal corresponds to a second unit interval of the full-rate clock signal.

4. The apparatus, as recited in claim 3. wherein the first and second. sensing circuits form a flip-flop responsive to the full-rata clock signal and the input signal.

5. The apparatus, as recited in claim 1, wherein the first sensing circuit comprises a first pair of cross-coupled devices and the second sensing circuit comprises a second pair of cross-coupled devices.

6. The apparatus, as recited in claim 1, wherein the first sampling stage is operative to reset a first differential node to a reference voltage level during the second phase of the clock signal.

7. The apparatus, as recited in claim 1, wherein the second sensing circuit comprises:
   a second sampling stage operative to receive the input signal on the differential input node and operative to sense a second difference between voltages on individual nodes of the differential input node during the second phase of the clock signal, the second sampling stage being operative to reset a second differential node to a reference voltage level during the first phase of the clock signal; and
   a second output stage operative to drive the second difference onto the node during the second phase of the clock signal, the second output stage being inoperative during the first phase of the clock signal.

8. The apparatus, as recited in claim 1, wherein the first sensing circuit drives the node only during the first phase of the clock and the second sensing circuit drives the node only during the second phase of the clock.

9. The apparatus, as recited in claim 1, wherein N is an integer greater than two.

10. The apparatus. as recited in claim 1, wherein each phase of the clock signal corresponds to a different unit interval of the input signal.

11. The apparatus, as recited in claim 1, further comprising:
    a clock divider circuit operative to provide the clock signal based on a full-rate clock signal, the full-rate clock signal having a frequency that is N times the frequency of the clock signal.

12. A method comprising:
    during a first phase of a clock signal, driving an output node with a first sample of an input signal by a first sensing circuit and providing a high impedance to the output node by a second sensing, circuit;
    during a second phase of the clock signal, providing a high impedance to the output node by the first sensing circuit and driving the output node with a second sample of the input signal by the second sensing circuit;
    sensing a first difference between voltages on individual nodes of a differential input node of the first sensing circuit during the first phase of the clock signal; and
    sensing a second difference. between voltages on individual nodes of a differential input node of the second sensing circuit during the second phase of the clock signal,
    wherein the input signal is sampled at a rate that is N times the rate of the clock signal, N being an integer greater than one.

13. The method, as recited in claim 12, wherein the first phase of the clock signal corresponds to a first unit interval of a full-rate clock signal and the second phase of the clock signal corresponds to a second unit interval of the full-rate clock signal.

14. The method, as recited in claim 12, further comprising:
    resetting a first differential node of a first sensing circuit to a reference voltage level during the first phase of the clock signal; and
    resetting a second differential node of a second sensing circuit to the reference voltage level during the second phase of the clock signal.

15. The method. as recited in claim 12, further comprising:
    dividing a full-rate clock signal by N to provide the clock signal, the full-rate clock signal having a frequency that is N times the frequency of the clock signal.

16. The method, as recited in claim 12 wherein N is an integer greater than two.

17. An apparatus comprising:
    means for driving a first sample of an input signal on an output node during a first phase of a clock signal and providing a high impedance to the output node during a second phase of the clock signal, wherein the means for driving comprises means for sensing a first difference between voltages on individual nodes of a differential input node of he means for driving during the first phase of the clock signal; and means for providing a high impedance to the output node during the first phase of the clock signal and driving a second sample of the input signal on the output node during the second phase of the clock signal, wherein the means for providing comprises means for sensing a second difference between voltages on individual nodes of a differential Maul node of the means for providing during the second phase of the clock signal;

wherein the input signal is sampled at a rate that is N times the rate of the clock signal, N being an integer greater than one.

18. A tangible computer-readable medium encoding a representation of an integrated circuit that comprises:

a first sensing circuit operative to drive on a node during a first phase of a clock signal a first sample of an input signal, the first sensing circuit being inoperative during a second phase of the clock signal. the first sensing circuit comprising:

a first sampling stage operative to receive dye input signal on a differential input node and operative to sense a first difference between voltages on individual nodes of the differential input node during the first phase of the clock signal; and a first output stage operative to receive the first difference onto the node during the first phase of the clock signal, the first output stage being inoperative during the second phase of the clock signal; and a second sensing circuit operative to drive on the node during the second phase of the clock signal a second sample of the input signal, the second sensing circuit being inoperative during the first phase of the clock signal, wherein a sampled signal on the node includes the first and second samples and has a bit rate that is N times the rate of the clock signal N, being an integer greater than one.

19. The tangible computer-readable medium encoding, as recited in claim 18, wherein the first sensing circuit comprises a first pair of cross-coupled devices and the second sensing circuit comprises a second pair of cross-coupled devices.

20. The tangible computer-readable medium encoding, as recited in claim 18, wherein the first sampling stage is operative to reset a first differential node to a reference voltage level during the second phase of the clock signal.

* * * * *

UNITED STATES PATENT AND TRADEMARK OFFICE
CERTIFICATE OF CORRECTION

PATENT NO. : 8,451,027 B2
APPLICATION NO. : 13/083641
DATED : May 28, 2013
INVENTOR(S) : Kunlun Kenny Jiang It is certified that error appears in the above-identified patent and that said Letters Patent is hereby corrected as shown below:

In the Claims:

In column 5, line 43, please replace "claim wherein" with --claim 1, wherein--;
line 53, please replace "3." with --3,--;
line 54, please delete the "." after "second";
line 55, please replace "full-rata" with --full-rate--;
In column 6, line 38, please delete the "." after "difference";
line 61, please replace "12" with --12,--;
In column 7, line 3, please replace "he" with --the--;
line 11, please replace "Maul" with --input--;
line 21, please replace "signal." with --signal,--;
line 23, please replace "dye" with --the--;
In column 8, line 4, please replace "receive" with --drive--;
line 15, please replace "signal N," with --signal, N--.

Signed and Sealed this
Twentieth Day of August, 2013

Teresa Stanek Rea
*Acting Director of the United States Patent and Trademark Office*